United States Patent [19]

Ota et al.

[11] 4,332,075
[45] Jun. 1, 1982

[54] METHOD OF PRODUCING THIN FILM TRANSISTOR ARRAY

[75] Inventors: Isao Ota, Osaka; Haruhiro Shirazawa, Daito; Toshio Tatsumichi, Ando; Hiroshi Kawarada, Hirakata; Tetsuro Ohtsuka, Takatsuki, all of Japan

[73] Assignee: Matsushita Electric Industrial Co., Ltd., Osaka, Japan

[21] Appl. No.: 41,507

[22] Filed: May 22, 1979

[30] Foreign Application Priority Data

May 26, 1978 [JP] Japan ................ 53-63598

[51] Int. Cl.³ .................... H01L 21/04; H01L 21/12
[52] U.S. Cl. ................... 29/571; 29/572; 29/578; 29/591; 357/4
[58] Field of Search ........... 29/572, 571, 591, 578; 357/4

[56] References Cited

U.S. PATENT DOCUMENTS

| | | | |
|---|---|---|---|
| 3,258,663 | 6/1966 | Weimer | 29/571 X |
| 3,423,821 | 1/1969 | Nishimura | 29/571 |
| 3,436,620 | 4/1969 | Diemer et al. | 29/571 X |
| 3,460,005 | 8/1969 | Kanda et al. | 29/571 X |
| 3,649,369 | 3/1972 | Hunsperger et al. | 148/1.5 |
| 3,766,637 | 10/1973 | Norris | 29/571 |
| 4,213,807 | 7/1980 | Rosnowski | 148/187 |

*Primary Examiner*—G. Ozaki
*Attorney, Agent, or Firm*—Wenderoth, Lind & Ponack

[57] ABSTRACT

A method of producing thin film transistor arrays and having at least 7 steps including: a first step of forming a first electrode layer uniformly over an insulating substrate; a second step of forming electrodes, such as drain and source electrodes and bus bars with a desired pattern by photoetching the first electrode; a third step of forming a uniform semiconducting layer on the surface of the substrate having the patterned electrodes; a fourth step of successively forming a uniform insulating layer over the uniformly deposited semiconducting layer while keeping the array in a vacuum; a fifth step of photoetching the uniformly deposited insulating layer into a desired pattern; a sixth step of photoetching the uniform semiconducting layer into the same pattern as the patterned insulating layer; a seventh step of forming a second electrode uniformly over the surface having the patterned electrodes and insulating layer; and an eighth step of photoetching the uniformly deposited second electrode into a desired pattern.

10 Claims, 7 Drawing Figures

METHOD OF PRODUCING THIN FILM TRANSISTOR ARRAY

BACKGROUND OF THE INVENTION

This invention relates to a method of producing a thin film transistor (TFT) array.

Thin film transistors are known to be field effect transistors in which the conductivity of the semiconductor fabricated between the source electrode and the drain electrode is controlled by a voltage applied to the third electrode (gate electrode) formed on the gate insulator in contact with the semiconductor.

The thin film transistor has been studied for its application to image sensors or display panels because of the ease of fabricating a switching array over a large area at a low material cost. For example, a display panel having a thin film transistor at each picture element can be greatly improved in its performance. There are, at present, a lot of display media devices such as gas plasma, electroluminescence, fluorescent displays activated by a low voltage electron beam, liquid crystal, electrochromic, electrophoretic and so on. In order to have an excellent contrast on the matrix display panel utilizing these display media devices, it is essential that the display medium have a sharp threshold in the voltage-brightness characteristics. However, some of the display media described above lack this sharpness in the threshold and are not suitable for a matrix display with many picture elements. Furthermore, even the matrix display panel with sharp threshold characteristics suffers from the decrease in brightness or response speed due to the decrease in the duty ratio for activation as the picture elements increase. A thin film transistor switching element, and, if necessary, a storage capacitor at each picture element, thus serve to improve the contrast ratio, the brightness and the response speed in the matrix display panel with a large number of picture elements.

Conventional methods of producing thin film transistor arrays are reviewed, for example, in Physics of Thin Films, Vol. 2, pp. 147–190, 1964, by P. K. Weimer, Academy Press, and Proceedings of the Society for Information Display, Vol. 17, pp. 39–55, 1976, by T. B. Brody. In these conventional methods, electrodes, semiconductors and gate insulators with desired patterns are formed on an insulating substrate by vacuum deposition through a metal mask with a desired aperture in contact with the surface of the substrate. The conventional method in which materials forming the electrodes, semiconductors and gate insulators are successively deposited on each other under high vacuum by one pumpdown has advantages in that a clean layer without contamination can be obtained using fewer production steps. However, it has some disadvantages in that it is difficult to obtain an evaporation metal mask with high precision and no defects, and in that high cost equipment is necessary for the successive exchanges of metal masks or the precise adjustment of the relative position of the two metal masks.

Furthermore, a thin metal mask is essential for the fabrication of a thin film transistor array of high density, and it becomes more difficult to accomplish a uniform contact between a thin metal mask and the substrate due to a decrease in a mechanical strength of the metal mask.

Thus, in the conventional methods, integration density of the array and the precision in dimension and position of the fabricated thin film transistor are seriously incompatible to each other.

A further disadvantage in the conventional method is the problem in the mis-registration of deposited layers caused by the difference between the thermal expansion coefficients of the substrate and the metal mask. The thermal expansion coefficients of glass substrates per degree centigrade are between about $3 \times 10^{-6}$ (Pyrex glass) and about $9 \times 10^{-6}$ (soda glass). On the other hand, those of metal masks are, e.g., (1 to 2)$\times 10^{-6}$ (invar), $6 \times 10^{-6}$ (kovar), $16.4 \times 10^{-6}$ (stainless steel: 18Cr, 8Ni). The difference of $1 \times 10^{-6}/°C$. in the thermal expansion coefficient between the substrate and the metal mask results in a misregistration of about 23 $\mu m$ under the temperature of 250° C. in a dimension which is 100 mm at room temperature.

It is quite difficult to select a combination of the substrate and the metal mask with a difference in their thermal expansion coefficients less than $1 \times 10^{-6}/°C.$, and at the same time the mis-registration of about 23 $\mu m$ is an unacceptable amount. As described above, it is hopeless to fabricate, by the conventional method based on the use of metal masks, an array of large size with an integration density more than about 50 elements/inch.

A method of fabricating a thin film transistor array without using a metal mask is described, for example, in Proceedings of the SID, Vol. 14, No. 4, 1973 or in Philips Technical Review, Vol. 27, 1966.

According to these conventional methods, electrodes of source, drain or gate are formed by photolithography method. The thin film transistor according to the former one of the above-noted conventional methods has, as shown in FIG. 1, features a structure wherein a gate insulating layer 1 and semiconducting layer 2 are deposited almost uniformly on the surface of the substrate 3, without being patterned. On the other hand, the latter one of the above-noted conventional methods discloses the TFT structure as shown in FIG. 2 in which electrodes of source, drain and gate, 4, 5, 6, respectively, are formed on the same surface of the substrate 3, and a gate insulator 1 which is formed by an anodic oxidation method covers only the gate electrode 6.

The present inventors have tried these conventional methods based on the use of metal masks or photolithography techniques in order to fabricate a TFT array with a high density, and have found that the metal mask method surfaces from a great difficulty when used for the purpose of fabricating a TFT array of high density, as already described before. On the other hand, as apparent from FIGS. 1 and 2, those TFT's have the same feature that the semiconducting layer 2 is formed on the upper surface of the insulating layer 1 when viewed from the side of the substrate 3.

The display panel combined with the TFT array usually uses, as display medium, an electroluminescence layer, a liquid crystal layer or a electrophoretic suspension layer. Such a display medium is usually sandwiched between the surface of the substrate with the TFT array and the common electrode. Therefore, the display medium is directly in contact with the surface of the semiconducting layer of the TFT. In order to avoid the deterioration in the characteristics of the display medium and/or the TFT's due to the electrochemical interaction between them, the semiconducting layer must be protected by an inert insulating layer. Since the protection layer must not cover the drain electrode which is electrically connected to the display medium, the step of depositing an inert protection layer with a specific pattern becomes inevitable. Furthermore, the disadvantage in the structure as shown in FIG. 1 lies in that the semiconducting layer 2 is apt to deteriorate in its characteristics due to the direct contact with the solvent when etching the semiconducting layer into a desired pattern, and furthermore, the dissolving peeling or contamination of the semiconducting layer often arises.

The TFT structure as shown in FIG. 2 has a disadvantage that it is necessary to remove the portions 2', as shown in FIG. 2, of the semiconducting layer, for example, by a photoetching technique in order to expose the given surface of the source and drain electrode if the TFT's produced are intended for use as a display panel. Due to this photoetching step, the TFT's, suffering from the peeling or contamination of the semiconducting layer, cannot show stable and reliable performance.

The conventional methods for fabricating the TFT based on the photolithography method are not always aimed at the application of the TFT array to display devices and are those that are not directly applicable to this purpose.

The reason why the photolithography method most popularly adopted in silicon IC technology has not yet yielded a satisfactory solution in the fabrication of the TFT's seems to be due mainly to the fact that that in addition to the difficulty in the precise photoetching of large size devices, the contamination during the etching process and the complexity of the processes, a practical production method has not yet been developed both in materials and processes.

SUMMARY OF THE INVENTION

It is an object of this invention to provide a practical production method of a thin film transistor array of uniformly high density using relatively few processes.

This object is achieved according to this invention by the providing of a method which includes:

a step of forming a first electrode layer almost uniformly on a insulating substrate;

a step of patterning the first electrode layer into a source electrode, drain electrode, bus bar electrode, or one or both of the electrodes used for a passive element such as resistor or capacitor;

a step of uniformly depositing a semiconducting layer, under vacuum, on the surface of the substrate having the first electrode layer with a given shape;

a step of uniformly depositing an insulating layer on the whole surface of the semiconducting layer;

a step of patterning the insulating layer into desired shape by means of a photoetching process;

a step of subsequently photoetching the semiconducting layer into the same shape as that of the insulating layer;

a step of uniformly depositing a second electrode layer on the exposed surfaces of the insulating layer and the first electrode layer on the substrate; and a step of patterning the second electrode layer into the shape of a gate electrode, bus connection electrode or electrodes used for a resistor or capacitor.

BRIEF DESCRIPTION OF THE DRAWINGS

This and other objects and features of this invention will be apparent from the descriptions herein and the accompanying drawings, in which.

DESCRIPTION OF THE PREFERRED EMBODIMENTS

This invention will be described hereinafter with the aid of the accompanying drawings. As described above, a transparent electrode, such as indium oxide or tin oxide or indium tin oxide is at first deposited, to a thickness of 200 Å to 1000 Å, on an insulating substrate such as glass in order to form the first electrode layer.

Figure 1:
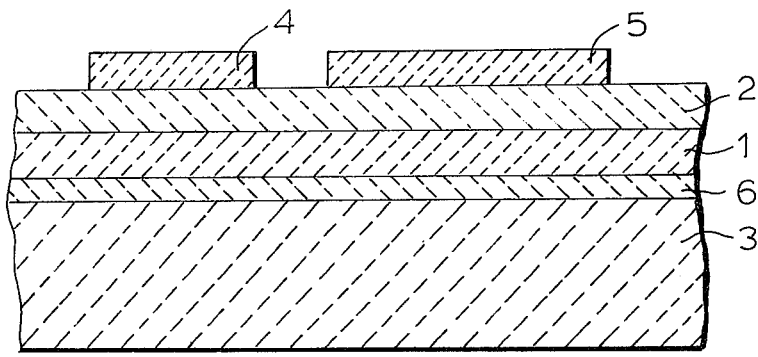
FIG. 1 is a cross-sectional view of a portion of a thin film transistor array according to a conventional method.
Figure 2:
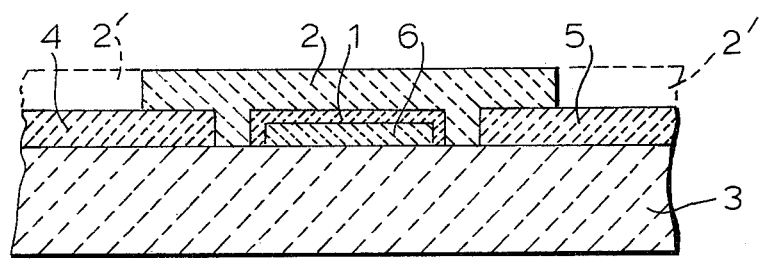
FIG. 2 is a cross-sectional view of a portion of a thin film transistor array according to another conventional method.
Figure 3:
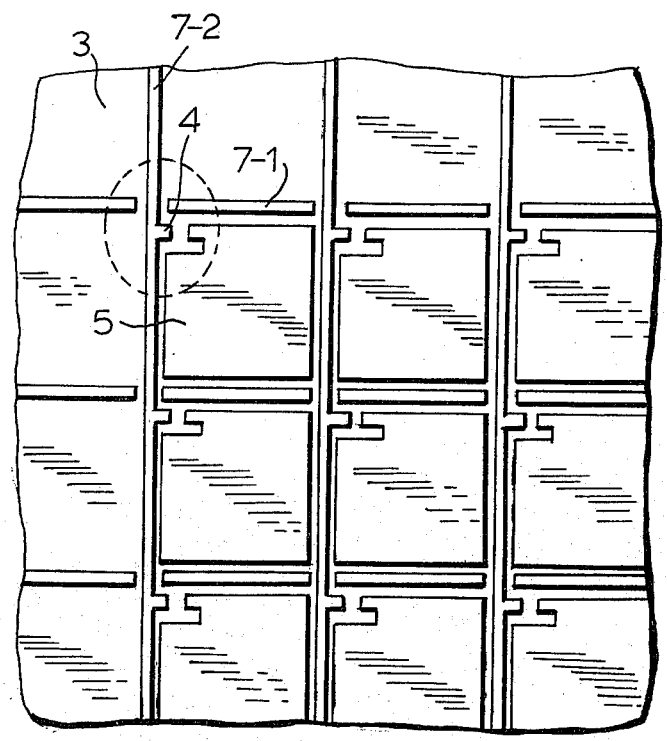
FIG. 3 is a plan view, at the second step of the production process, of a portion of a thin film transistor array according to an example of a method of this invention.
Figure 4:
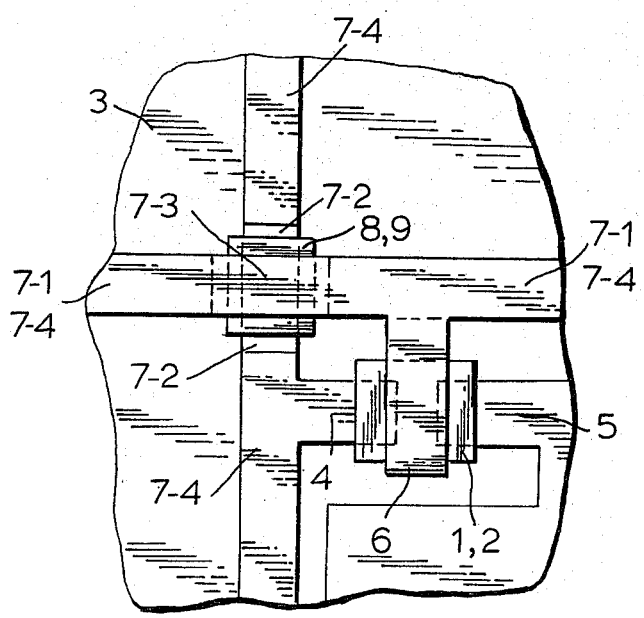
FIG. 4 is a plan view of a portion of a thin film transistor array according to the example of the method of this invention, which portion corresponds to that indicated by the dotted circle in FIG. 3.

In the second step, using a well known photoresist, such as phenolnovolak resin, the first electrode layer is patterned as shown in FIG. 3 into the shape of a source electrode 4, drain electrode 5, bus bar electrodes 7-1, 7-2 or, if necessary, one or both of the electrodes used for a resistor or capacitor. (These latter electrodes are omitted in FIG. 3 for simplicity of explanation). A dilute hydrochloric acid can be used as the etching solution for the first electrode such as indium oxide, tin oxide or indium tin oxide.

After removing the photoresist remaining on the patterned 1st electrodes 4, 5, 7-1, 7-2 and carefully cleaning and drying the substrate, in the third step a semiconducting material such as cadmium selenide, cadmium sulfide, lead sulfide, or tellurium is uniformly deposited by vacuum evaporation or sputtering, to a thickness of 50 Å to 2000 Å, to form the semiconducting layer.

Successively after deposition of the semiconducting layer, in the fourth step, an insulating layer such as aluminum oxide, silicon nitride and silicon oxide is deposited uniformly by vacuum evaporation or sputtering techniques to a thickness of from 0.1 μm to 0.6 μm over the semiconducting layer. After taking out the substrate 3, from the vacuum bell jar, with the semiconducting layer and the insulating layer deposited thereon, in the fifth step, the photoresist, after being uniformly coated over the insulating layer on the substrate 3, is photoetched into the shapes corresponding to those of the gate insulating layer 1 and crossover insulating layer 8. The substrate 3 with the given pattern of the photoresist layer thereon is then exposed to the etching solution or etching gas so that the unnecessary portions of the insulating layer is removed by etching. When the insulating layer 1 or 8 is composed of aluminum oxide, a hot phosphoric acid (about 60° C.) is suitable for etching the aluminum oxide. The etching rate is about 30 Å/S at 60° C. In the sixth step, the substrate 3 is exposed to the etching solution or etching gas as well as in the fifth step except that in this step, the etching solution or gas appropriate for the semiconducting layer 2 or 9 is used. When cadmium selenide is used as the semiconducting layer, it has been found that 0.1–0.7wt% aqueous solution of bromine is effectively suitable as the etching solution for the cadmium selenide. The etching rate of the CdSe is about 15 Å/s at 20° C. with an etching solution of 0.35wt%.

During the steps described above, a substrate 3 is obtained which has a double layer of the semiconducting layer 2(or 9) and insulating layer 1(or 8) thereon with the same shape covering given portions of the source electrode 4 and drain electrode 5 and covering given portions of the bus bar electrode 7-2 for use as crossover insulation. Here, the semiconducting layer 9 under the insulating layer 8 at the portion of the crossover insulation does not function as a semiconductor element.

After removing the photoresist remaining on the surfaces of the insulating layer 1, 8 and carefully cleaning the substrate 3, in the seventh step, the second electrode material is deposited uniformly on almost the whole surface of the side of the substrate 3 having the layers of the first electrodes 4, 5, 7-1, 7-2, semiconductors 2, 9 (these are not exposed and covered by the insulating layers 1, 8) and insulating layers 2, 9.

Metallic aluminum or chromium is suitable as the material for the second electrode. Electrode materials such as gold, indium oxide and tin oxide are not appropriate for the second electrode because the etching solutions or gas used for those electrode materials are apt to deteriorate the semiconductor and the insulators 1, 8 for the gate or the crossover insulation, respectively.

In the eighth step, the second electrode layer is photoetched into a given pattern so as to form the gate electrode 6, connection electrodes 7-3 for the electrical connections of the bus bar electrode 7-1, and either a resistor or capacitor (not shown in the drawings). Here, the electrode 7-4, deposited on the electrode 7-1 or 7-2, serves both to mechanically and electrically strengthen those electrodes 7-1 and 7-2.

The photoresist layer remaining on the surface of the gate electrode 6, and connection electrodes 7-4 and 7-3 does not have to be removed but after being hardened by appropriate heat treatment, serves to protect the surfaces of these electrodes.

In the steps described above, the formation of crossover insulation layer 8 is completed simultaneously with the formation of the gate insulator 1 and semiconductor 2 for the TFT's. However, when the high voltage operation of the TFT array is required, the basic process described above can be modified. It is more desirable to form an electrically more stable and reliable insulating layer with sufficient thickness for use as a crossover insulation layer and capacitance layer. In this case, an additional process is required to form a thick insulating layer for crossover insulator or capacitor, either before the third step or before the second step described above.

As an insulator material for this purpose, a metal oxide such as aluminum oxide or cerium oxide or an organic polymer such as a photoresist can be utilized.

According to our experiments, a metal oxide layer with a thickness of about 1 μm or a photoresist layer with a thickness of about 2 μm is satisfactory for use as the electrical insulation for a voltage strength more than 50 volts. Both insulator materials can be easily patterned into a desired shape by at first forming a uniform layer by vacuum evaporation, sputtering, spraying and so on and then photoetching it into a given pattern.

In the performance of the TFT's, since a thick gate insulator requires a high gate voltage for obtaining the desired drain current, the thin gate insulator is the preferable. However, for the applications using a high gate voltage, a gate insulator thicker than 0.6 μm is desirable.

Figure 5:
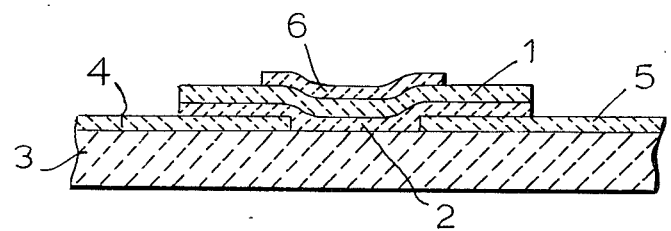
FIG. 5 is a cross-sectional view of a portion of a thin film transistor array according to an elementary example of the method of this invention.
Figure 6:
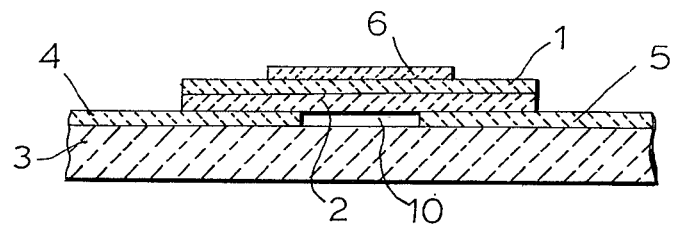
FIG. 6 is a cross-sectional view of a portion of a thin film transistor array according to an example of the method of this invention improved over the elementary example of FIG. 5.
Figure 7:
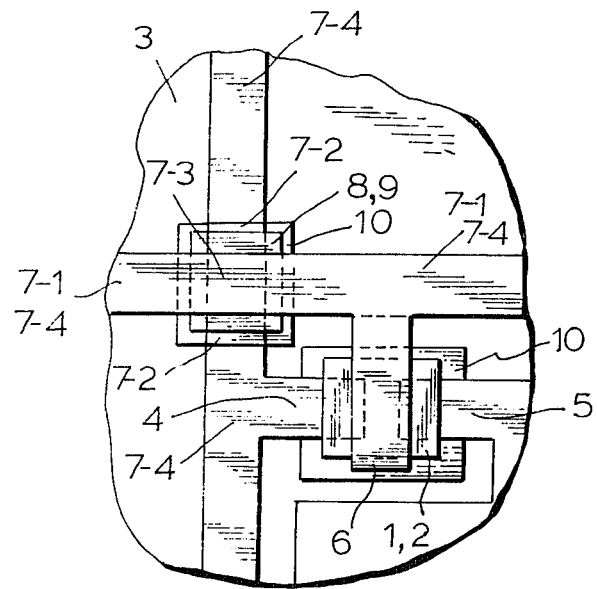
FIG. 7 is a plan view of a portion of a thin film transistor array according to the improved example of the method of this invention as of FIG. 6, which portion corresponds to that indicated by the dotted circle in FIG. 3.

It has also been found that the TFT's obtained by the present method based on a photoetching process can be improved by other modifications. The cross section of the TFT fabricated by the basic method is shown in FIG. 5. There is an undulation in the semiconductor, gate insulator and gate electrode at the edges of the source and drain electrode 4 and 5 due to the thickness of those electrodes. The existence of this undulation, which is apt to give some damage to the semiconducting layer 2 or insulating layer 1 during the steps of etching the photoresist, insulator and semiconductor layers, might cause undesired side etching, cracking or peeling of the semiconducting layer and/or insulating layer during such etching steps. Then, according to this invention, this undulation is removed by depositing an insulating layer 10 with almost same thickness as that of the first electrode between the electrodes of the source and the drain and at the crossing portion of the bus bar electrode as shown in FIGS. 6 and 7. Thereby, a good effect can be obtained in the production yield of the TFT array and the precision of the shape of the semiconductor 2, 9 and insulator 1, 8. Furthermore, the additional advantage has been obtained by providing the insulating layer 10 for removing the undulation. The advantage is that the TFT produced with this insulating layer 10 shows a higher off-resistance and higher on/off ratio of the drain current than that produced without it. Though the reason is not clear at present, this effect is considered to be caused perhaps by the reduction of the amount of the induced charge in the semiconductor resulting from the contact with the deposited insulating layer 10.

As described above, though the provision of another insulating layer for the diminishment of undulation results in an increase in production steps, the step used to deposit the insulating layer on the whole substrate having the source and drain electrodes with a given shape and the step used to photoetch the insulating layer into a given pattern, enables the obtaining of a high production yield and better performance of the TFT array.

As the insulating layer 10, aluminum oxide has been found to be preferable.

As apparent from the foregoing, according to the basic method according to this invention for producing a TFT array in which a crossover insulator is formed at the same time as the formation of the semiconducting layer 2 and the insulating layer 1, putting-in and taking-out of the substrate 3 to and from the vacuum vessel are carried out three times; coating, exposing and developing of photoresist layers are carried out three times; photoetching of the electrodes is carried out twice; photoetching of the insulator and semiconducting layer is carried out once, respectively. Though it is not appropriate to say that the present method comprises very few steps, this method does not require any special care except for the setting of the photomask for the exposure of the photoresist to the light pattern and never requires the delicate setting of a metal mask to the substrate for vacuum evaporation with a given pattern. Therefore, the present method ultimately can result in a high production rate by the simultaneous treatment of many substrates, and has a capability of fabricating, without difficulty, a TFT array with the density of more than 100 lines/inch.

The smallest size TFT having been fabricated so far on the basis of the present invention has a channel length dimension of 10 $\mu$m and a channel width of 20 $\mu$m, and has shown excellent TFT characteristics such as an on/off ratio of drain current which is more than $10^4$. The TFT's produced by the present method generally show high on/off drain currents. For an application requiring extremely low off current (<10 nA), the post heat treatment (at 200° C. for about 2 hours) of the array is preferable for reducing the off-current and obtaining a higher on/off ratio of the drain current. According to the present method, it has also been found that it is possible to relatively easily fabricate a TFT array having a precision of the order of tens of $\mu$m with respect to the electrodes for the gate, source, drain and bus bar, gate and crossover insulators, and channel semiconductor uniformly on a substrate which is more than 10 cm $\times$ 10 cm in size.

Further advantages in the present method are as follows.

Especially in a field effect transistor, the boundary between the gate insulating layer 1 and the semiconducting layer 2 has a remarkable effect upon the characteristics of the TFT produced. If there are mobile ions, polarizable impurities and/or a trapping state of charges are present at the boundary, the stable and excellent performance of the TFT may not be expected. Therefore, it is preferable to keep the boundary between the semiconducting layer 2 and the insulating layer 1 very clean and free from contamination. According to the present method, since the semiconducting layer 2 and insulating layer 1 are successively deposited under high vacuum, this delicate boundary layer can be prevented from contamination.

It has also been found that the electrode material such as the indium oxide or tin oxide, or indium tin oxide makes an ohmic contact to the cadmium selenide semiconducting layer. Therefore, it is possible to use such transparent conducting materials directly as the source and drain electrodes 4 and 5. This brings about an advantage in that a transmissive-type display device utilizing liquid crystal techniques can be easily fabricated by fewer steps. If an opaque metal electrode must be utilized as the source and drain electrode for achieving the ohmic contact with the semiconducting layer, an additional process for providing a transparent electrode electrically connected to the source or drain electrode becomes necessary for the fabrication of a TFT array used for a transmissive type display device.

According to the present invention which does not need the use of a metal mask during vacuum evaporation, the substrate can be heated during evaporation because concern for the difference in the thermal expansion between the substrate and metal mask is unnecessary. The heating of the substrate during the evaporation generally results in a better performance of the fabricated TFT's mainly by the excellent adhesion of the evaporated material to the substrate, an improvement in the electrical durability of the insulating material for gate insulator or crossover insulation layer, and a capability of the control of the electrical resistance of the semiconducting layer.

In the foregoing description, the present invention's method of producing the TFT array has been explained mainly for the purpose of producing the switching array for the display panel. However, the present invention is not limited to that application but is applicable to any other thin film active circuits consisting of TFT active elements, thin film resistor and thin film capacitors such as the driving circuits for a display panel.

What is claimed is:

1. A method producing a thin film transistor comprising: uniformly forming a first electrode layer over an insulating substrate; forming electrodes for at least one of source, drain, and interconnecting lines with desired patterns by photoetching said first electrode layer; forming a uniform semiconducting layer on a surface of the substrate having said patterned electrodes; successively forming a uniform insulating layer over said uniform semiconducting layer; photoetching said uniform insulating layer into a desired pattern; photoetching said uniform semiconducting layer into the same pattern as said patterned insulating layer; forming a second electrode uniformly over the surface having said patterned electrode and insulating layer; and photoetching said uniformly deposited second electrode into a desired pattern.

2. A method of producing a thin film transistor as claimed in claim 1, wherein said first electrode is made of a conductive electrode material selected from the group consisting of indium oxide, tin oxide and indium tin oxide.

3. A method of producing a thin film transistor as claimed in claim 1, comprising a further step, effected between said electrode forming step and said semiconducting layer forming step, of forming an insulating layer with a given shape and substantially the same thickness as said first electrode, at least on the portion of the substrate where said first electrode layer has been partially removed, and wherein the semiconducting layer and insulating layer having given shapes are to be provided in successive steps.

4. A method of producing a thin film transistor as claimed in claim 1, comprising a further step, effected between said electrode forming step and said semiconducting layer forming step, of forming an insulating layer by means of either a vacuum evaporation or sputtering method.

5. A method of producing a thin film transistor as claimed in claim 1, comprising a further step, effected between said semiconducting layer photoetching step and said second electrode forming step, of forming an insulating layer by means of either a vacuum evaporation or sputtering method.

6. A method of producing thin film transistor as claimed in claim 4 or 5, wherein said insulating layer is made of a photosensitive organic polymer.

7. A method of producing a thin film transistor as claimed in claim 1, wherein said semiconducting layer material is made of cadmium selenide.

8. A method of producing a thin film transistor as claimed in claim 7, wherein an etching solution used for photoetching said semiconducting layer material is an aqueous solution of from 0.1 to 0.7wt.% of bromine.

9. A method of producing a thin film transistor as claimed in claim 1, 3, 4 or 5, wherein said insulating layer is made of aluminum oxide.

10. A method of producing a thin film transistor as claimed in claim 9, wherein an etching solution used for photoetching said insulating layer is hot phosphoric acid.

* * * * *